United States Patent
Baek et al.

(10) Patent No.: US 7,570,105 B1
(45) Date of Patent: Aug. 4, 2009

(54) VARIABLE CURRENT CHARGE PUMP WITH MODULAR SWITCH CIRCUIT

(75) Inventors: Sun Woo Baek, San Jose, CA (US); Henry Y. Lui, San Jose, CA (US); Surinder Singh, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/867,416

(22) Filed: Oct. 4, 2007

(51) Int. Cl.
*G05F 1/10* (2006.01)

(52) U.S. Cl. .......................... 327/536; 327/148; 327/157
(58) Field of Classification Search ................ None
See application file for complete search history.

(56) References Cited

U.S. PATENT DOCUMENTS

| | | | |
|---|---|---|---|
| 5,208,546 A * | 5/1993 | Nagaraj et al. ............... | 327/157 |
| 5,459,755 A | 10/1995 | Iga et al. | |
| 5,592,120 A * | 1/1997 | Palmer et al. ............... | 327/536 |
| 5,767,735 A * | 6/1998 | Javanifard et al. ........... | 327/536 |
| 6,169,458 B1 | 1/2001 | Shenoy et al. | |
| 6,222,402 B1 * | 4/2001 | Boerstler et al. ............ | 327/157 |
| 6,278,332 B1 | 8/2001 | Nelson et al. | |
| 6,573,798 B2 | 6/2003 | Uto | |
| 6,611,161 B1 | 8/2003 | Kumar et al. | |
| 6,825,730 B1 | 11/2004 | Sun | |
| 7,002,416 B2 | 2/2006 | Pettersen et al. | |
| 7,012,473 B1 | 3/2006 | Kokolakis | |
| 7,064,600 B1 * | 6/2006 | Ming et al. .................. | 327/536 |
| 7,167,037 B2 * | 1/2007 | Rodgers et al. ............. | 327/384 |
| 7,183,822 B1 * | 2/2007 | Bolton et al. ............... | 327/157 |
| 7,184,510 B2 * | 2/2007 | Jung ........................... | 375/374 |
| 7,193,479 B2 * | 3/2007 | Fujita .......................... | 331/16 |
| 7,202,718 B2 * | 4/2007 | Lindner et al. .............. | 327/157 |
| 7,365,593 B1 * | 4/2008 | Swanson ..................... | 327/536 |
| 7,385,429 B1 * | 6/2008 | Mei et al. .................... | 327/157 |
| 2006/0044031 A1 * | 3/2006 | Cheung et al. .............. | 327/157 |

* cited by examiner

*Primary Examiner*—Cassandra Cox
(74) *Attorney, Agent, or Firm*—Steven J. Cahill

(57) ABSTRACT

A charge pump circuit includes switch circuit modules and current modules. The number of switch circuit modules that are coupled to receive current from one of the current modules is variable. The output current of the charge pump circuit increases as more of the switch circuit modules are coupled to receive current from the current modules. The net on-resistance of the switch circuit modules decreases as more of the switch circuit modules are coupled to receive current from the current modules. Charge coupling caused by the net parasitic gate-to-drain capacitance of switching transistors in the switch circuit modules is reduced at smaller output current settings of the charge pump circuit.

22 Claims, 6 Drawing Sheets

VARIABLE CURRENT CHARGE PUMP WITH MODULAR SWITCH CIRCUIT

BACKGROUND OF THE INVENTION

The present invention relates to electronic circuits, and more particularly, to charge pump circuits.

The performance of a phase-locked loop (PLL) is generally characterized by the timing of the feedback clock signal with respect to the timing of the reference clock signal. When a PLL is in lock mode, the average time difference between the phase of the reference clock signal and the phase of the feedback clock signal at the inputs of the phase-frequency detector (PFD) is referred to as the static phase error (SPE).

FIG. 1A illustrates a prior art charge pump circuit 100 used in a PLL. Charge pump circuit 100 includes p-channel metal oxide semiconductor field-effect transistors (MOSFETs) 101-102, n-channel MOSFETs 103-104, unity gain amplifier 105, and two variable current sources 106 and 107.

A phase-frequency detector (not shown) generates four digital control signals UP, UPb, DN, and DNb. UPb is the digital inverse of UP, and DNb is the digital inverse of DN. The UP signal controls the conductive state of p-channel MOSFET 101. The UPb signal controls the conductive state of p-channel MOSFET 102. The DNb signal controls the conductive state of n-channel MOSFET 103. The DN signal controls the conductive state of n-channel MOSFET 104.

Variable current source 106 contains a MOSFET that generates a current $I_{UP}$, and variable current source 107 contains a MOSFET that generates a current $I_{DN}$. The current settings for $I_{UP}$ and $I_{DN}$ are achieved by varying the gate-source voltages of the MOSFETs in current sources 106 and 107, which changes the voltage headroom requirement. Larger current settings for current sources 106 and 107 require more voltage headroom. When the drain-source voltages of the MOSFETs in currents sources 106 and 107 are not sufficient to cause the MOSFETs to be in saturation, currents $I_{UP}$ and $I_{DN}$ may be mismatched. The mismatch of $I_{UP}$ and $I_{DN}$ is one of the sources of SPE in the PLL. Therefore, the single-transistor implementation of current source 106 and current source 107 is not optimum to handle different charge pump current settings.

FIG. 1B illustrates a prior art charge pump circuit used in a PLL. Charge pump circuit 150 in FIG. 1B includes MOSFETs 101-104, unity gain amplifier 105, current sources 111-114 and 121-124, and switches SU1, SU2, SUn, SD1, SD2, and SDn. Current sources 111-114 generate currents $I_{UP1}$, $I_{UP2}$, $I_{UP3}$, and $I_{UPn}$, respectively. Current sources 121-124 generate currents $I_{DN1}$, $I_{DN2}$, $I_{DN3}$, and $I_{DNn}$, respectively. One or more of switches SU1, SU2, SUn, etc. and corresponding switches SD1, SD2, SDn, etc. are opened or closed to vary the current through charge pump 150.

The gate-source voltages of the MOSFETs in current sources 111-114 and 121-124 are constant and independent of the total current through charge pump 150. The voltage headroom requirement is also fixed, and charge pump 150 generates less SPE.

BRIEF SUMMARY OF THE INVENTION

According to some embodiments of the present invention, a charge pump circuit includes switch circuit modules and current modules. The number of switch circuit modules that are coupled to receive current from one of the current modules is variable. The output current of the charge pump circuit increases as more of the switch circuit modules are coupled to receive current from the current modules. The net on-resistance of the switch circuit modules decreases as more of the switch circuit modules are coupled to receive current from the current modules.

According to other embodiments, the net parasitic gate-to-drain capacitance of switching transistors in the switch circuit modules increases as more of the switch circuit modules are coupled to receive current from the current modules. When fewer switch circuit modules are coupled to receive current from the current modules, the net parasitic gate-to-drain capacitance of the switching transistors decreases. As a result, charge coupling caused by the net parasitic gate-to-drain capacitance of the switching transistors is reduced at smaller output current settings of the charge pump circuit.

Various objects, features, and advantages of the present invention will become apparent upon consideration of the following detailed description and the accompanying drawings.

DETAILED DESCRIPTION OF THE INVENTION

Figures 1A, 1B:
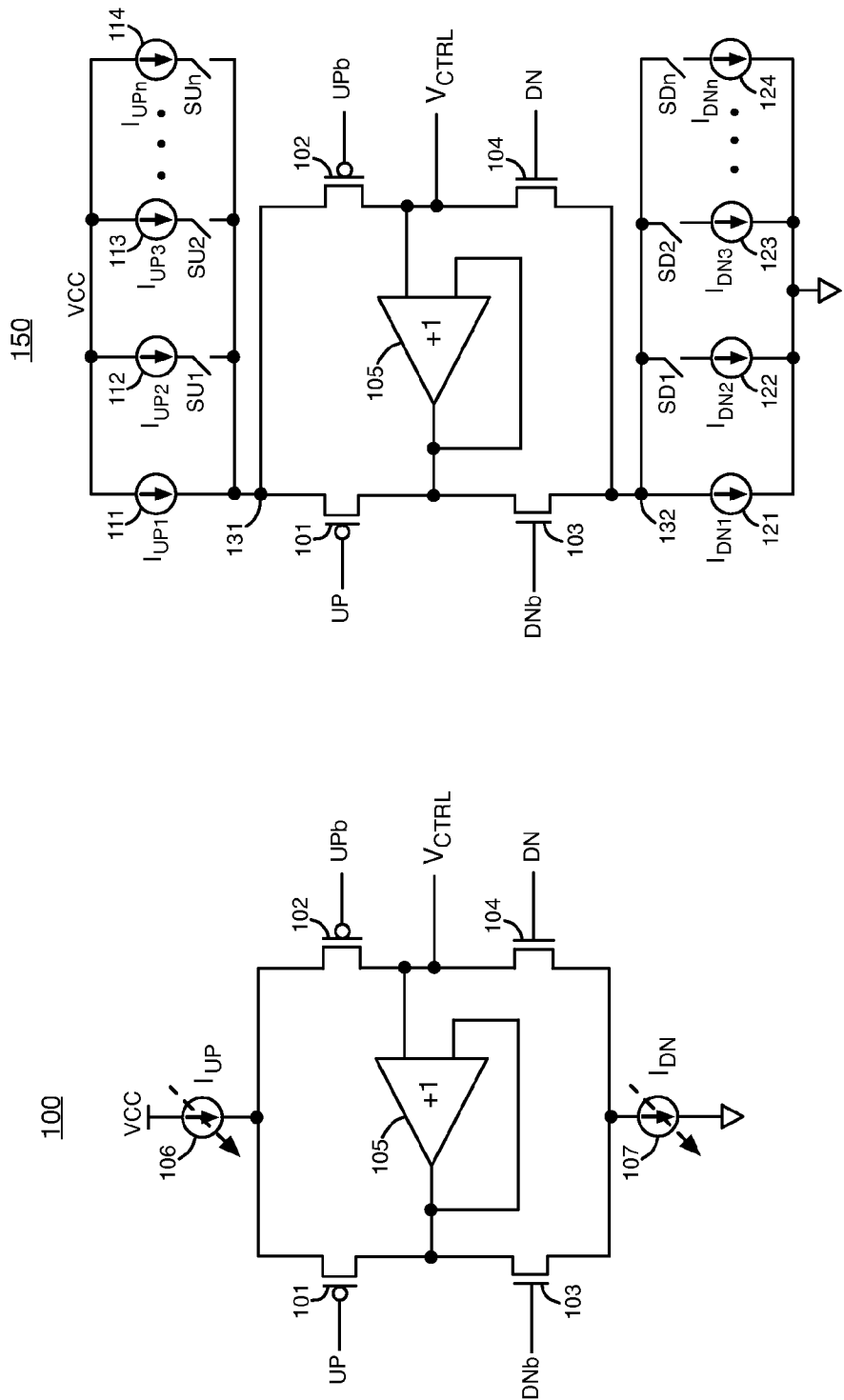
FIG. 1A illustrates a prior art charge pump circuit used in a PLL.
FIG. 1B illustrates another prior art charge pump circuit used in a PLL.

A non-zero static phase error (SPE) in a PLL can cause clock phase-alignment problems, such as hold-time issues that result in functional failures or setup-time issues that result in the reduction of the maximum frequency. Therefore, it is important to minimize the SPE in a PLL.

Charge sharing and charge coupling in transistors 101-104 in charge pump 150 contribute to the SPE of the PLL. When the phase-frequency detector is inactive, transistors 101 and 103 are switched on to maintain the voltage at node 131 above voltage $V_{CTRL}$ so that current flows from node 131 to $V_{CTRL}$ when transistor 102 turns on.

The voltage at node 131 can be less than $V_{CTRL}$ when the drain-source voltage drop across transistor 101 is smaller than the offset voltage of unity gain amplifier 105. This effect happens at small charge pump current settings, causing the drain-source voltage of transistor 101 to vary with the charge pump current. When the voltage at node 131 is lower than $V_{CTRL}$ and transistor 102 turn on, charge leaks out momentarily from the loop filter as a result of charge sharing between the parasitic capacitance at node 131 and the capacitance in the loop filer at $V_{CTRL}$. As a result, $V_{CTRL}$ decreases and the PLL develops a phase-offset (i.e. SPE) between the reference clock and feedback clock signals to compensate for the leaked charge.

When the gate input voltage of transistor 102 toggles, the parasitic gate-to-drain overlap capacitance ($C_{GD}$) of transistor 102 causes charge to be coupled to the output node at $V_{CTRL}$. The coupled charge depends on input voltage signal slew-rate (dv/dt) and $C_{GD}$. Both of these quantities are fixed for transistor 102 and are independent of the output current of the charge pump. Thus, a fixed amount of charge is coupled to $V_{CTRL}$ in every cycle of the phase-frequency detector. However, the SPE compensation by the PLL is inversely proportional to the output current of the charge pump. For a fixed size transistor 102, a lower output current for the charge pump causes the SPE to increase significantly.

Figure 2A:
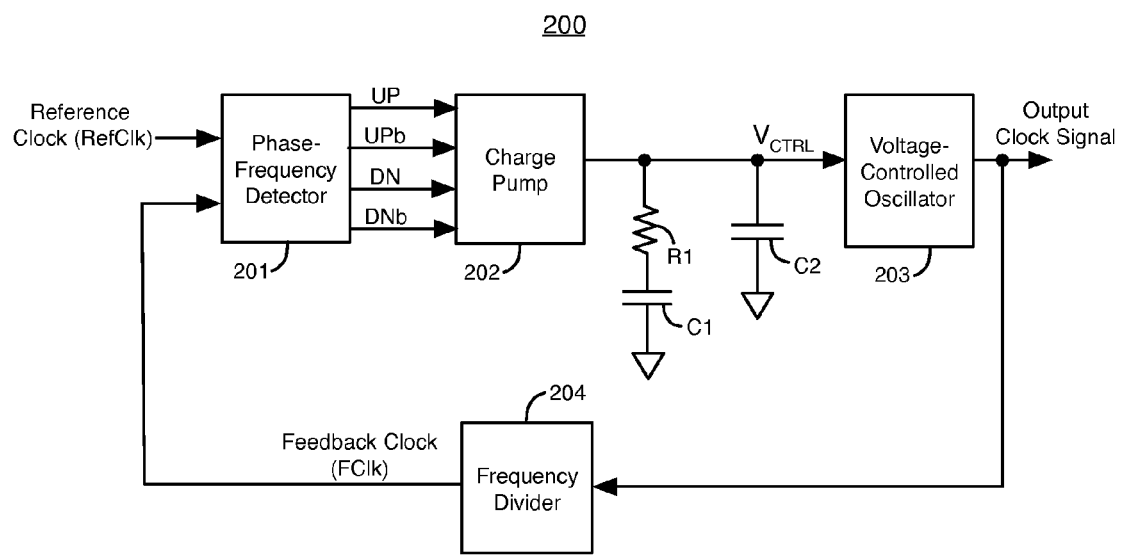
FIG. 2A illustrates a phase-locked loop (PLL), according to an embodiment of the present invention.

FIG. 2A illustrates a phase-locked loop (PLL) 200, according to an embodiment of the present invention. PLL 200 is merely one example of a PLL that can include embodiments of the present invention. It should be understood that embodiments of the present invention can be used in PLLs having numerous other configurations.

PLL 200 is a feedback loop circuit that includes a phase-frequency detector circuit 201, a charge pump circuit 202, a voltage-controlled oscillator circuit 203, a frequency divider circuit 204, resistor R1, and capacitors C1-C2. Phase-frequency detector (PFD) 201 compares the phase and the frequency of an input reference clock signal (RefClk) to the phase and the frequency of a feedback clock signal (FClk) generated by frequency divider 204.

Phase-frequency detector 201 generates UP, UPb, DN, and DNb error signals that are indicative of the difference between the phases and frequencies of RefClk and the feedback clock signal FClk. Signal UPb is the digital inverse of signal UP, and signal DNb is the digital inverse of signal DN.

The error signals are transmitted to charge pump 202. Charge pump 202 converts the error signals into a control voltage $V_{CTRL}$ that is transmitted to voltage-controlled oscillator (VCO) 203. Resistor R1 and capacitors C1 and C2 form a low pass filter that attenuates high frequency components of control voltage $V_{CTRL}$. Resistor R1 and capacitors C1 and C2 function as a loop filter in PLL 200.

Voltage-controlled oscillator (VCO) 203 generates an output clock signal. VCO 203 adjusts the frequency of its output clock signal in response to changes in control voltage $V_{CTRL}$. According to alternative embodiments, PLL 200 can have a current-controlled oscillator or another type of oscillator, instead of VCO 203.

Frequency divider 204 divides the frequency of the output clock signal of VCO 203 to generate feedback clock signal FClk. Frequency divider 204 can, for example, be a divide-by-N counter circuit. The counter circuit allows the output clock signal of VCO 203 to run at a frequency greater than the frequency of the input reference clock signal RefClk. PLL 200 adjusts the control voltage $V_{CTRL}$ until both the phase and the frequency of feedback clock signal FClk match the phase and the frequency of reference clock signal RefClk. PLL 200 enters lock mode when the phases and the frequencies of RefClk and FClk are approximately the same.

Figure 2B:
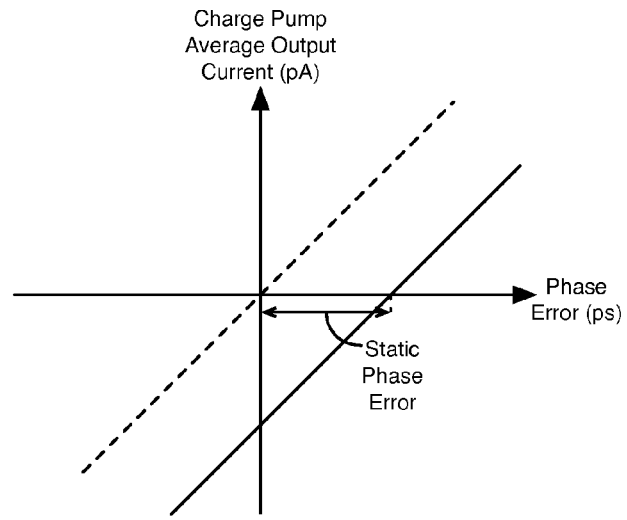
FIG. 2B graphically illustrates the time-averaged output current of a charge pump in the PLL of FIG. 2A as a function of the phase error seen by the phase-frequency detector.

FIG. 2B graphically illustrates the time-averaged output current of charge pump 202 as a function of the phase error at the inputs of PFD 201. In an ideal PLL, the curve for the time-averaged output current of charge pump 202 passes through the origin as indicated by the diagonal dotted line in FIG. 2B. The time-averaged output current of charge pump 202 should be zero in the lock mode of the PLL. However, the actual output current curve is shifted by the amount of static phase error (SPE) as indicated by diagonal solid line. The SPE of a PLL is the time difference (e.g., in picoseconds) between corresponding edges of the reference and feedback clock signals when the PLL is in lock mode.

Figure 3:
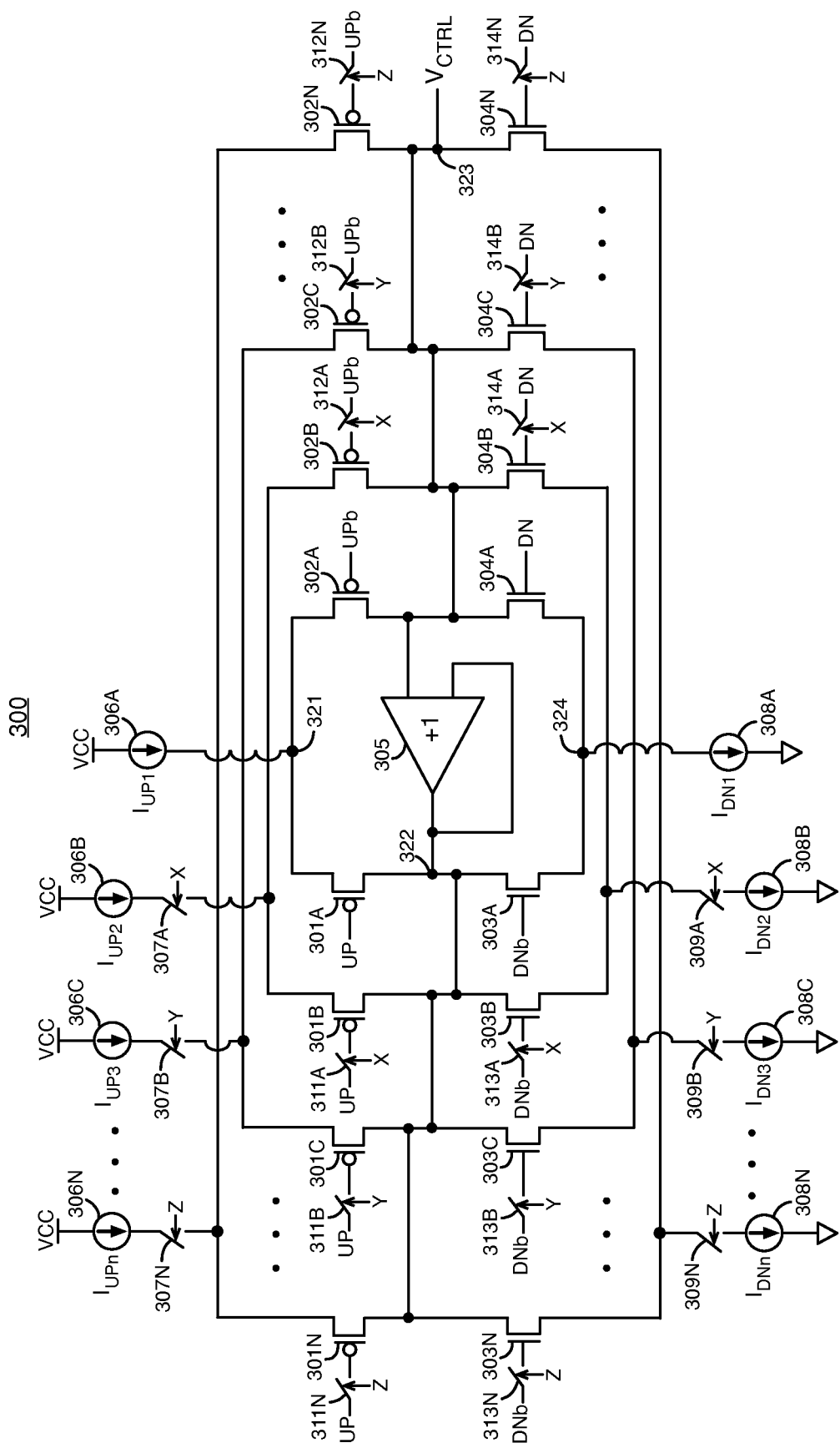
FIG. 3 illustrates an example of a charge pump circuit that has a modular switch circuit and a variable output current, according to an embodiment of the present invention.

FIG. 3 illustrates an example of a charge pump circuit 300 that has a modular switch circuit and a variable output current, according to an embodiment of the present invention. Charge pump circuit 300 can be used, for example, as charge pump 202 in FIG. 2. Charge pump 300 has an output node 323 that is coupled to resistor R1 and capacitor C2 shown in FIG. 2A. $V_{CTRL}$ is the voltage at node 323.

Charge pump 300 has a set of p-channel MOSFETs 301A, 301B, 301C, 301N, etc. (collectively referred to as transistors 301) and a set of p-channel MOSFETs 302A, 302B, 302C, 302N, etc. (collectively referred to as transistors 302). Charge pump 300 also has a set of n-channel MOSFETs 303A, 303B, 303C, 303N, etc. (collectively referred to as transistors 303) and a set of n-channel MOSFETs 304A, 304B, 304C, 304N, etc. (collectively referred to as transistors 304). Charge pump 300 further includes a set of switches 307A, 307B, 307N, etc. (collectively referred to as switches 307), a set of switches 309A, 309B, 309N, etc. (collectively referred to as switches 309), a set of switches 311A, 311B, 311N, etc. (collectively referred to as switches 311), a set of switches 312A, 312B, 312N, etc. (collectively referred to as switches 312), a set of switches 313A, 313B, 313N, etc. (collectively referred to as switches 313), and a set of switches 314A, 314B, 314N, etc. (collectively referred to as switches 314).

Charge pump 300 also includes a set of current sources 306A, 306B, 306C, 306N, etc. (collectively referred to as current sources 306), a set of current sources 308A, 308B, 308C, 308N, etc. (collectively referred to as current sources 308), and a unity gain amplifier (i.e., a unity gain buffer) 305. Current sources 306 are coupled to a supply voltage VCC, and current sources 308 are coupled to a common ground voltage. Current sources 306A, 306B, 306C, and 306N generate constant currents $I_{UP1}$, $I_{UP2}$, $I_{UP3}$, and $I_{UPn}$, respectively. Current sources 308A, 308B, 308C, and 308N generate constant currents $I_{DN1}$, $I_{DN2}$, $I_{DN3}$, and $I_{DNn}$, respectively.

Charge pump 300 has two or more stages. Each stage includes a switch circuit module and a current module. The switch circuit module in each stage includes a transistor 301, a transistor 302, a transistor 303, and a transistor 304 coupled together as shown in FIG. 3. For example, the first switch circuit module includes transistors 301A, 302A, 303A, and 304A. The second switch circuit module includes transistors 301B, 302B, 303B, and 304B. The third switch circuit module includes transistors 301C, 302C, 303C, and 304C. The fourth switch circuit module includes transistors 301N, 302N, 303N, and 304N.

Because UPb is the digital inverse of UP, transistors 301A and 302A are switched out of phase with each other. In other words, transistor 301A is on when transistor 302A is off, and transistor 302A is on when transistor 301A is off. Transistors 301B, 301C, etc. are also switched out of phase with transistors 302B, 302C, etc. when they are controlled by signals UP and UPb through switches 311 and 312, respectively. Because DNb is the digital inverse of DN, transistors 303A and 304A are switched out of phase with each other. Transistors 303B, 303C, etc. are also switched out of phase with transistors 304B, 304C, etc. when they are controlled by signals DNb and DN through switches 313 and 314, respectively. Transistors 301-304 function as switching transistors.

The current module in each stage of charge pump 300 includes a current source 306 and a current source 308. For example, the first current module includes current sources 306A and 308A. The second current module includes current sources 306B and 308B. The third current module includes current sources 306C and 308C. The fourth current module includes current sources 306N and 308N. Charge pump 300 can have any number of stages with any number of circuits 301-304, 306 and 308, although four stages are shown in FIG. 3 as an example.

The second stage, as well as each additional stage, has a switch 307, a switch 309, a switch 311, a switch 312, a switch 313, and a switch 314. Each of the switches 307, 309, and 311-314 is opened and closed in response to the state of a control signal. For example, control signal X controls the opening and closing of switches 307A, 309A, 311A, 312A, 313A, and 314A. Control signal Y controls the opening and closing of switches 307B, 309B, 311B, 312B, 313B, and 314B. Control signal Z controls the opening and closing of switches 307N, 309N, 311N, 312N, 313N, and 314N. Control signals X-Z can, for example, be generated in response to configuration data bits stored in memory in a field programmable gate array. The control signals that control the opening and closing of switches 307, 309, and 311-314 are generated independently of the UP, UPb, DN, and DNb control signals.

Each switch circuit module in charge pump 300 is dedicated to a corresponding current module. The number of switch circuit modules can be scaled with a desired number of current modules to vary the output current $I_{CP}$ of charge pump 300. Specifically, the output current $I_{CP}$ of charge pump 300 increases by increasing the number of switch circuit modules that are coupled to receive current from a corresponding one of the current modules. The output current $I_{CP}$ of charge pump 300 decreases by decreasing the number of switch circuit modules that are coupled to receive current from a corresponding one of the current modules. The output current $I_{CP}$ of charge pump 300 can be varied to affect, for example, the bandwidth of the PLL or various other settings of the PLL.

For example, signal X closes switch 307A to couple current source 306B to transistors 301B and 302B, and signal X closes switch 309A to couple current source 308B to transistors 303B and 304B. Signal X closes switch 311A to allow the UP signal to control transistor 301B, signal X closes switch 312A to allow the UPb signal to control transistor 302B, signal X closes switch 313A to allow the DNb signal to control transistor 303B, and signal X closes switch 314A to allow the DN signal to control transistor 304B. When these 6 switches are closed and the other switches in charge pump 300 are open, the UP output current of charge pump 300 through transistors 302 equals $I_{UP1}+I_{UP2}$, and the DN output current of charge pump 300 through transistors 304 equals $I_{DN1}+I_{DN2}$. The UP output current charges the loop filter in PLL 200, and the DN output current discharges the loop filter in PLL 200. In general, the UP output current through transistors 302 equals the DN output current through transistors 304, and both are referred to as output current $I_{CP}$.

As another example, signal Y closes switch 307B to couple current source 306C to transistors 301C and 302C, and signal Y closes switch 309B to couple current source 308C to transistors 303C and 304C. Signal Y closes switch 311B to allow the UP signal to control transistor 301C, signal Y closes switch 312B to allow the UPb signal to control transistor 302C, signal Y closes switch 313B to allow the DNb signal to control transistor 303C, and signal Y closes switch 314B to allow the DN signal to control transistor 304C. When switches 307A-B, 309A-B, 311A-B, 312A-B, 313A-B, and 314A-B are closed, and the other switches in charge pump 300 are open, the output current of charge pump 300 through transistors 302 equals $I_{UP1}+I_{UP2}+I_{UP3}$, and the output current of charge pump 300 through transistors 304 equals $I_{DN1}+I_{DN2}+I_{DN3}$.

The output current $I_{CP}$ of charge pump 300 and the net on-resistance of transistors 302 and 304 vary according to the number of switch circuit modules that are coupled to receive current from a current module through switches 307 and 309 and that are coupled to receive control signals UP, UPb, DN, and DNb through switches 311-314. Increasing the number of switch circuit modules that are coupled to receive signals UP, UPb, DN, and DNb and current from a current module causes the output current $I_{CP}$ of charge pump 300 to increase and the net on-resistance of transistors 302 and 304 to decrease. Decreasing the number of switch circuit modules that are coupled to receive signals UP, UPb, DN, and DNb and current from a current module causes the output current $I_{CP}$ of charge pump 300 to decrease and the net on-resistance of transistors 302 and 304 to increase.

In the specific example of FIG. 3, the output current $I_{CP}$ of charge pump 300 is directly proportional to the number of switch circuit modules that are coupled to receive signals UP, UPb, DN, and DNb and current from a current module. The on-resistance of transistors 302 and 304 is inversely proportional to the number of switch circuit modules that are coupled to receive signals UP, UPb, DN, and DNb and current from a current module. Although in other embodiments, different ratios can be used between the number of switch circuit modules that conduct current in the charge pump, the output current of the charge pump, and the net on-resistance of transistors 302 and 304.

Unity gain amplifier 305 has a first non-inverting input coupled to the drains of each of transistors 302 and 304 and to the output node 323 of charge pump 300. Unity gain amplifier 305 has a second inverting input and an output coupled to the drains of each of transistors 301 and 303 at node 322. Unity gain amplifier 305 attempts to maintain the voltage at node 322 substantially equal to $V_{CTRL}$ when transistors 302 and 304 turn off, and transistors 301 and 303 turn on. After the phase comparison is finished, no charge sharing occurs between the capacitance at output node 323 and the parasitic capacitance at nodes 321 and 324.

The prior art can cause charge sharing when the drain-source voltage of the switch transistor is less than the offset voltage of amplifier 105. At the instant of the phase comparison, transistors 101 and 104 turn off, transistors 102 and 103 turn on, and the voltage at node 131 is less than $V_{CTRL}$, because the drain-source voltage $V_{DS}$ of transistor 101 is less than the offset voltage of amplifier 105 at a low output current $I_{CP}$ setting. Charge leaks out momentarily from $V_{CTRL}$ because of charge sharing between the parasitic capacitance at node 131 and the capacitance at the output node.

The first switch circuit module containing transistors 301A, 302A, 303A, and 304A receives a constant source current from current source 306A and a constant sink current from current source 308A. Each of the additional switch circuit modules receives a constant source current from one of current sources 306B, 306C, etc. when the corresponding switch 307 is closed, and a constant sink current from one of current sources 308B, 308C, etc. when a corresponding switch 309 is closed. As a result, the drain-source voltage $V_{DS}$ across each of the transistors 301-304 coupled to receive one of signals UP, UPb, DN, or DNb is substantially constant for each of the output current $I_{CP}$ settings of charge pump 300.

Amplifier 305 typically has an offset voltage $V_{OS}$ that can cause the voltage at node 322 to be slightly less than $V_{CTRL}$ (e.g., by a few millivolts). In charge pump 300, the drain-source voltage $V_{DS}$ across each of the transistors 301 coupled to signal UP is larger than the offset voltage $V_{OS}$ of amplifier 305, which prevents charge sharing and reduces the SPE of the PLL. Charge pump 300 prevents charge sharing even at small output current $I_{CP}$ settings, because the drain-source voltage $V_{DS}$ of each of transistors 301-304 coupled to receive one of signals UP, UPb, DN, or DNb remains substantially constant across each of the output current $I_{CP}$ settings of charge pump 300.

When the UPb signal toggles, the net gate-to-drain parasitic capacitance ($C_{GD}$) of the transistors 302 that are turned on by UPb can cause charge to be coupled to output node 323. The charge coupling effect caused by $C_{GD}$ increases the SPE of the PLL. In charge pump 300, the net capacitance $C_{GD}$ of transistors 302 varies according to the number of switch circuit modules that are coupled to receive current from a current module through switches 307 and 309 and that are coupled to receive control signals UP, UPb, DN, and DNb through switches 311-314. When more switch circuit modules are coupled to receive the control signals and current from a current module, the net gate-to-drain parasitic capacitance $C_{GD}$ of transistors 302 increases. When fewer switch circuit modules are coupled to receive the control signals and current from a current module, the net capacitance $C_{GD}$ of transistors 302 decreases. As a result, the charge coupling that is caused by the net capacitance $C_{GD}$ of transistors 302 is reduced for smaller output current $I_{CP}$ settings of charge pump 300. In the specific example of FIG. 3, the net parasitic capacitance $C_{GD}$ of transistors 302 is directly proportional to the number of switch circuit modules that are coupled to receive the control signals and current from a current module in charge pump 300.

The static phase error (SPE) between reference clock signal RefClk and feedback clock signal FClk in lock mode is proportional to the net parasitic gate-to-drain capacitance ($C_{GD}$) between the gate and the drain of transistors 302 and inversely proportional to the total output current $I_{CP}$ of charge pump 300 as shown in equation (1).

$$SPE \propto \frac{C_{GD}}{I_{CP}} \quad (1)$$

As mentioned above, the output current $I_{CP}$ and the net parasitic capacitance $C_{GD}$ of transistors 302 vary according to the number of switch circuit modules that are coupled to conduct current in charge pump 300. Percentage changes to $I_{CP}$ and $C_{GD}$ mostly cancel out from equation (1) between different output current $I_{CP}$ settings of charge pump 300. For example, when more switch circuit modules are coupled to conduct current in charge pump 300, $I_{CP}$ and the net $C_{GD}$ increase by about the same percentage, and the SPE remains about the same. When fewer switch circuit modules are coupled to conduct current in charge pump 300, $I_{CP}$ and the net $C_{GD}$ decrease by about the same percentage, and the SPE remains about the same.

Charge pump 300 of FIG. 3 reduces the SPE between RefClk and FClk compared to the prior art charge pumps shown in FIGS. 1A and 1B. The SPE in charge pump 300 is substantially reduced at small output currents, as shown, for example, in Table 1 below. In Table 1, Wp represents the channel width of the p-channel MOSFET that controls current flow from supply voltage VCC to the loop filter in micrometers (μA), Wn represents the channel width of the n-channel MOSFET that controls current flow from the loop filter to ground in μA, and SPE is measured in picoseconds (ps). With respect to charge pump 300, Wp and Wn represent the equivalent channel widths of the respective transistors 302 and 304 that are coupled to corresponding current sources 306 and 308 and control signals UP, UPb, DN, and DNb. The worst-case SPE is reduced by approximately 69.1% in charge pump 300 when the charge pump output current $I_{CP}$ is 10 microamps (μA).

TABLE 1

| SS-40° C. | Prior Art | | Charge Pump 300 | | | | |
|---|---|---|---|---|---|---|---|
| | | | | Equivalent Switch | | | |
| $I_{CP}$ Settings | Switch | | Number of | Size [μm] | | | SPE Reduction |
| [μA] | Size [μm] | SPE [ps] | Switch Modules | Wp | Wn | SPE [ps] | [%] |
| 10 | Wp = 8 | 181 | 1 | 1 | 0.5 | 56 | −69.1 |
| 20 | Wn = 4 | 88 | 2 | 2 | 1 | 57 | −35.2 |
| 40 | | 68 | 4 | 4 | 2 | 56 | −17.6 |
| 80 | | 60 | 8 | 8 | 4 | 60 | 0 |

The switch circuit modules in charge pump 300 do not have an impact on the power consumption of the charge-pump, because the current through each switch circuit module is constant. The layout impact from having multiple switch circuit modules in charge pump 300 is negligible relative to the total die size of the PLL.

According to an alternative embodiment of the present invention, the additional transistors on the right side or on the left side of charge pump 300 can be removed. For example, transistors 302B, 302C, 302N, etc. and transistors 304B, 304C, 304N, etc. can be removed, switches 307A, 307B, 307N, etc. are coupled to node 321, and switches 309A, 309B, 309N, etc. are coupled to node 324. As another example, transistors 301B, 301C, 301N, etc. and transistors 303B, 303C, 303N, etc. can be removed, switches 307A, 307B, 307N, etc. are coupled to node 321, and switches 309A, 309B, 309N, etc. are coupled to node 324.

Figure 4:
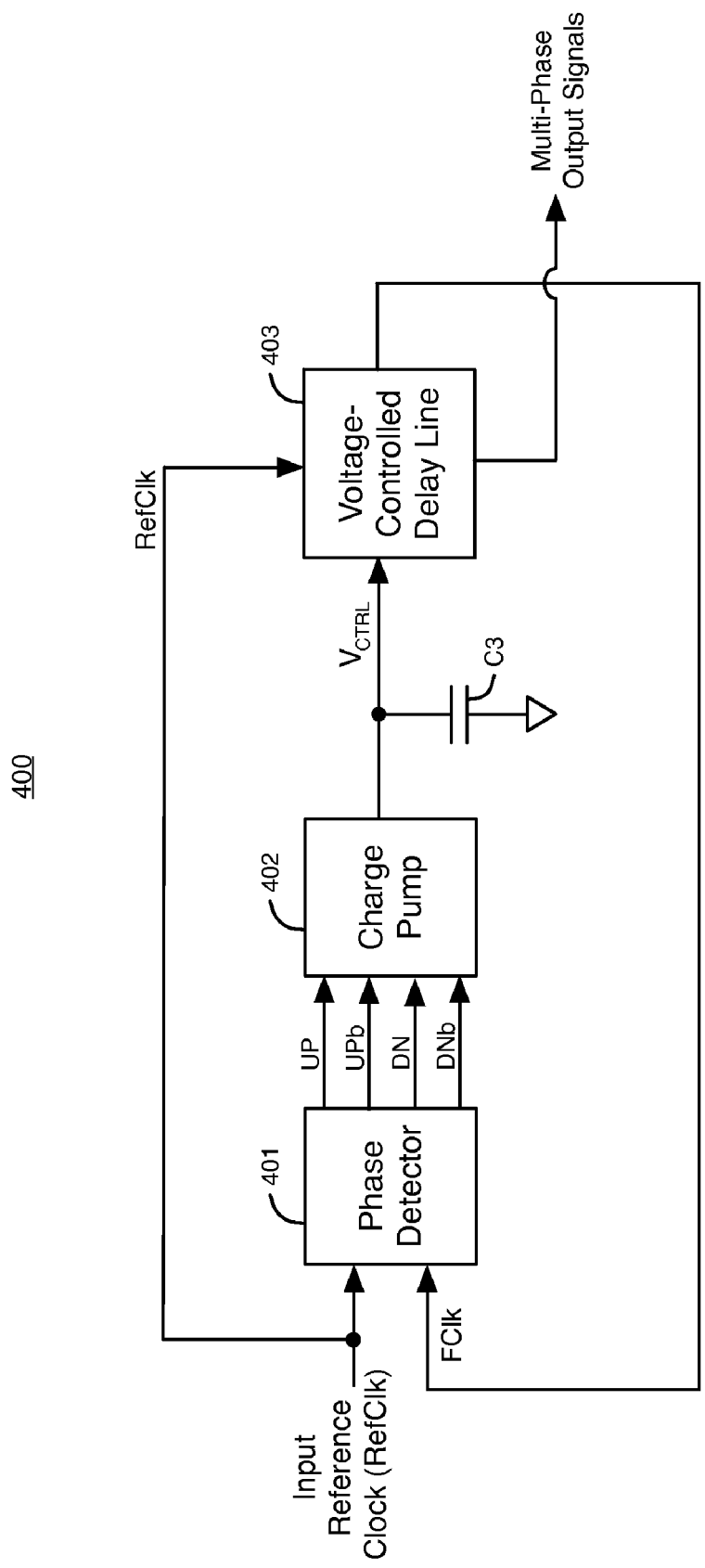
FIG. 4 illustrates a delay-locked loop (DLL), according to an embodiment of the present invention.

FIG. 4 illustrates a delay-locked loop (DLL) 400, according to an embodiment of the present invention. DLL 400 is one example of a DLL that can include embodiments of the present invention. It should be understood that embodiments of the present invention can be used with DLLs having numerous other configurations.

Delay-locked loop (DLL) 400 is a feedback loop circuit that includes a phase detector circuit 401, a charge pump circuit 402, a capacitor C3, and a voltage-controlled delay line (VCDL) circuit 403. Phase detector 401 compares an input reference clock signal RefClk to a feedback clock signal FClk that has the same frequency. Because the frequencies of RefClk and FClk are the same, phase detector 401 compares the phases of these two signals.

Phase detector 401 generates UP, DN, UPb, and DNb error signals that are indicative of the difference between the phases of RefClk and FClk. The UP, UPb, DN, and DNb error signals are transmitted to charge pump 402. Charge pump 402 converts the UP, UPb, DN, and DNb error signals into a control voltage $V_{CTRL}$.

Capacitor C3 is a loop filter that is coupled between the output node of charge pump 402 and ground. Capacitor C3 filters high frequency signals in the control voltage $V_{CTRL}$.

Voltage-controlled delay line (VCDL) 403 includes a set of delay circuits. The delay circuits delay the reference clock signal RefClk to generate the feedback clock signal FClk. VCDL 403 adjusts the delay of the delay circuits in response to changes in control voltage $V_{CTRL}$. DLL 400 adjusts the phase of FClk in response to changes in control voltage $V_{CTRL}$ until the phase of FClk matches the phase of RefClk. VCDL 403 also generates a set of output signals that have multiple phases.

According to another embodiment of the present invention, charge pump circuit 300 shown in FIG. 3 is used as charge pump circuit 402 in DLL 400. Charge pump circuit 300 can provide a smaller SPE between RefClk and FClk when DLL 400 is in lock mode, as described above.

According to yet another embodiment of the present invention, charge pump circuit 300 shown in FIG. 3 is used as a charge pump in a clock and data recovery (CDR) loop in a transceiver.

Figure 5:
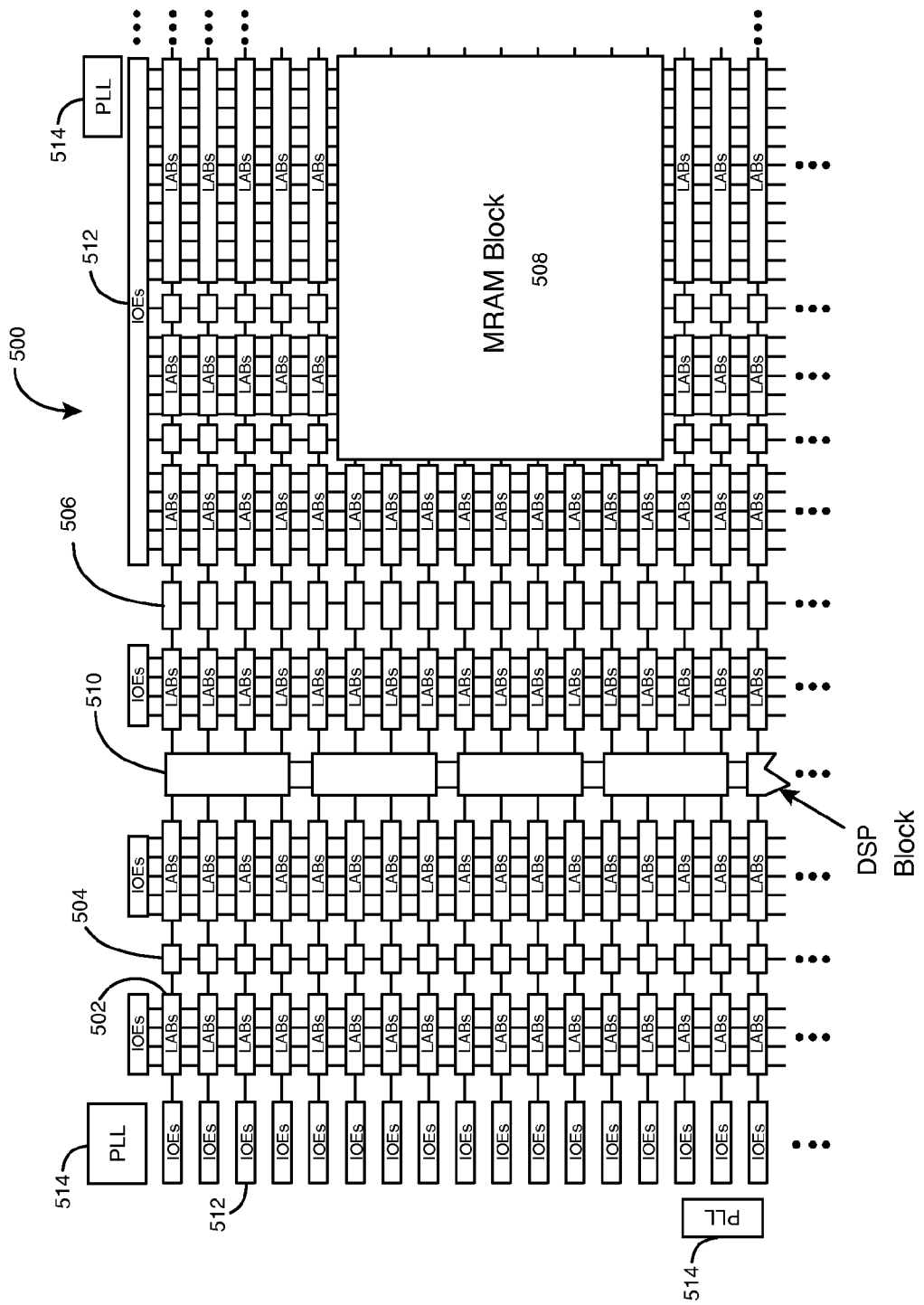
FIG. 5 is a simplified partial block diagram of a field programmable gate array that can include aspects of the present invention.

FIG. 5 is a simplified partial block diagram of a field programmable gate array (FPGA) 500 that can include aspects of the present invention. FPGA 500 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 500 includes a two-dimensional array of programmable logic array blocks (or LABs) 502 that are interconnected by a network of column and row interconnect conductors of varying length and speed. LABs 502 include multiple (e.g., 10) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 500 also includes a distributed memory structure including random access memory (RAM) blocks of varying sizes provided throughout the array. The RAM blocks include, for example, blocks 504, blocks 506, and block 508. These memory blocks can also include shift registers and FIFO buffers.

FPGA 500 further includes digital signal processing (DSP) blocks 510 that can implement, for example, multipliers with add or subtract features. Each input/output pin on FPGA 500 is fed by an input/output element (IOE) 512 located, in this example, around the periphery of the integrated circuit. Each input/output pin is an external terminal of the FPGA. The input/output pins support numerous single-ended and differential input/output standards.

FPGA 500 includes PLLs 514 that are also located around the periphery of the integrated circuit in this example. PLLs 514 generate clock signals that are driven throughout FPGA 500. Connections between PLLs 514 and other circuit elements on FPGA 500 are not shown in FIG. 5. It is to be understood that FPGA 500 is described herein for illustrative purposes only and that the present invention can be implemented in many different types of PLDs, FPGAs, and ASICs.

Figure 6:
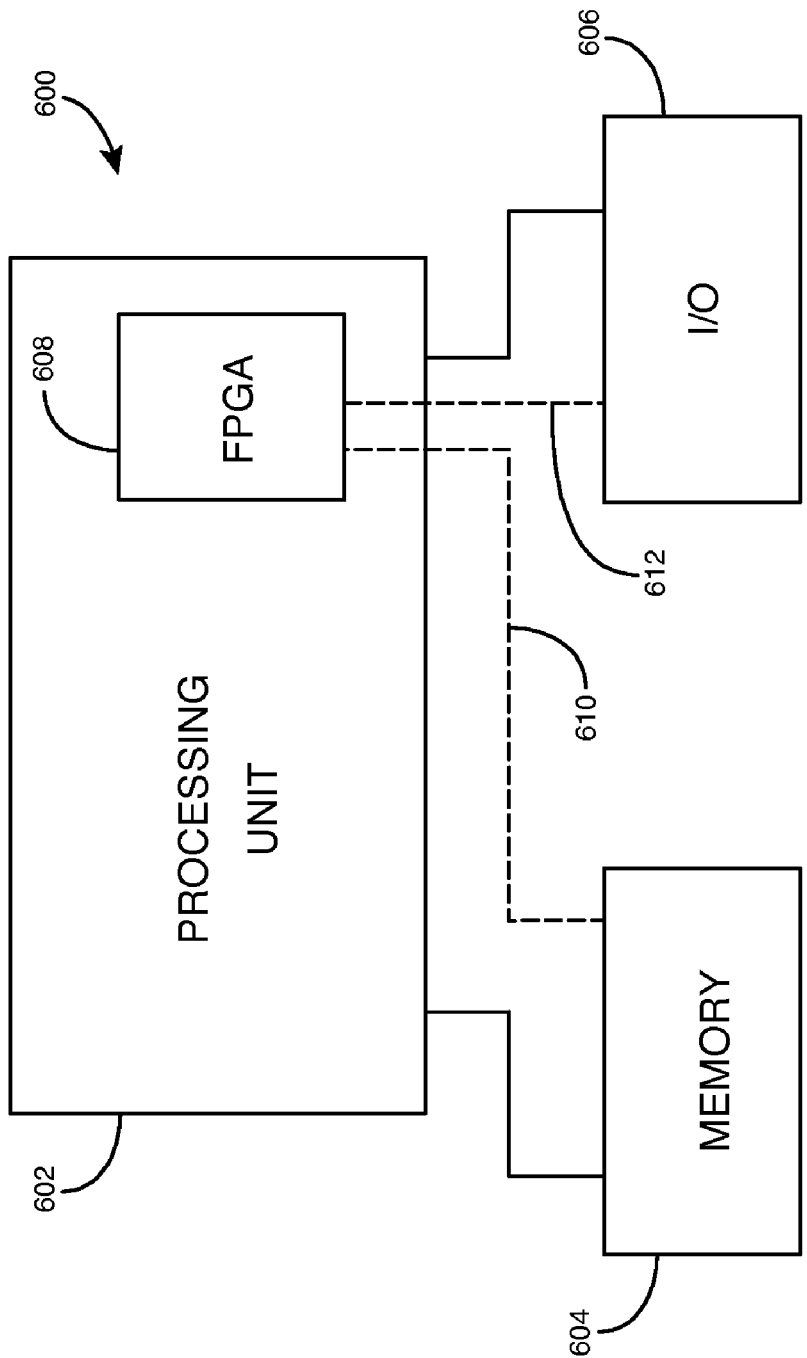
FIG. 6 shows a block diagram of an exemplary digital system that can embody techniques of the present invention.

The present invention can also be implemented in a system that has an FPGA as one of several components. FIG. 6 shows a block diagram of an exemplary digital system 600 that can embody techniques of the present invention. System 600 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 600 can be provided on a single board, on multiple boards, or within multiple enclosures.

System 600 includes a processing unit 602, a memory unit 604, and an I/O unit 606 interconnected together by one or more buses. According to this exemplary embodiment, an FPGA 608 is embedded in processing unit 602. FPGA 608 can serve many different purposes within the system in FIG. 6. FPGA 608 can, for example, be a logical building block of processing unit 602, supporting its internal and external operations. FPGA 608 is programmed to implement the logical functions necessary to carry on its particular role in system operation. FPGA 608 can be specially coupled to memory 604 through connection 610 and to I/O unit 606 through connection 612.

Processing unit 602 can direct data to an appropriate system component for processing or storage, execute a program stored in memory 604, receive and transmit data via I/O unit 606, or other similar function. Processing unit 602 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 608 can control the logical operations of the system. As another example, FPGA 608 acts as a reconfigurable processor, which can be reprogrammed as needed to handle a particular computing task. Alternately, FPGA 608 can itself include an embedded microprocessor. Memory unit 604 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A charge pump circuit comprising:
   switch circuit modules;
   current modules, wherein a number of the switch circuit modules that are coupled to receive current from the current modules is variable, and wherein increasing the number of the switch circuit modules that are coupled to receive current from the current modules causes an output current of the charge pump circuit to increase; and first switches that cause current to flow between one of the switch circuit modules and one of the current modules when the first switches are closed.

2. The charge pump circuit defined in claim 1 further comprising:
second switches that are closed to couple a second one of the switch circuit modules to a second one of the current modules.

3. The charge pump circuit defined in claim 2 further comprising:
third switches that are closed to couple a third one of the switch circuit modules to a third one of the current modules.

4. The charge pump circuit defined in claim 1 wherein the charge pump circuit is part of a phase-locked loop circuit.

5. The charge pump circuit defined in claim 1 wherein the charge pump circuit is part of a delay-locked loop circuit.

6. The charge pump circuit defined in claim 1 wherein the charge pump circuit is coupled into a clock and data recovery circuit.

7. A charge pump circuit comprising:
switch circuit modules;
current modules, wherein a number of the switch circuit modules that are coupled to receive current from the current modules is variable, and wherein increasing the number of the switch circuit modules that are coupled to receive current from the current modules causes an output current of the charge pump circuit to increase; and
first switches, wherein the switch circuit modules comprise first and second switch circuit modules, each of the switch circuit modules comprises switching transistors, and conductive states of the switching transistors in the second switch circuit module are controlled by control signals when the first switches are closed.

8. The charge pump circuit defined in claim 7 further comprising:
second switches, wherein the switch circuit modules further comprise a third switch circuit module, and conductive states of the switching transistors in the third switch circuit module are controlled by the control signals when the second switches are closed.

9. The charge pump circuit defined in claim 8 further comprising:
third switches, wherein the switch circuit modules further comprise a fourth switch circuit module, and conductive states of the switching transistors in the fourth switch circuit module are controlled by the control signals when the third switches are closed.

10. A charge pump circuit comprising:
switch circuit modules; and
current modules, wherein a number of the switch circuit modules that are coupled to receive current from the current modules is variable, and increasing the number of the switch circuit modules that are coupled to receive current from the current modules causes an output current of the charge pump circuit to increase and a net on-resistance of the switch circuit modules to decrease, and
wherein charge coupling caused by parasitic gate-to-drain capacitances of switching transistors in the switch circuit modules decreases at smaller output current settings of the charge pump circuit.

11. A charge pump circuit comprising:
first and second current modules;
a first switch circuit module coupled to receive current from the first current module;
first and second sets of switches; and
a second switch circuit module coupled to the first switch circuit module and coupled to receive current from the second current module when the first set of switches are closed, wherein control signals control conductive states of switching transistors in the second switch circuit module when the second set of switches are closed.

12. The charge pump circuit defined in claim 11 further comprising:
a third current module;
third and fourth sets of switches; and
a third switch circuit module coupled to the first and the second switch circuit modules and coupled to receive current from the third current module when the third set of switches are closed, wherein the control signals control conductive states of switching transistors in the third switch circuit module when the fourth set of switches are closed.

13. The charge pump circuit defined in claim 12 further comprising:
a fourth current module;
fifth and sixth sets of switches; and
a fourth switch circuit module coupled to the first, the second, and the third switch circuit modules and coupled to receive current from the fourth current module when the fifth set of switches are closed, wherein the control signals control conductive states of switching transistors in the fourth switch circuit module when the sixth set of switches are closed.

14. The charge pump circuit defined in claim 11 wherein charge coupling caused by parasitic gate-to-drain capacitances of switching transistors in the first and the second switch circuit modules decreases at smaller output current settings of the charge pump circuit, and wherein the charge pump circuit further comprises:
a unity gain amplifier coupled to the first and the second switch circuit modules.

15. The charge pump circuit defined in claim 11 wherein the charge pump circuit is fabricated on a programmable logic integrated circuit.

16. The charge pump circuit defined in claim 11 wherein the charge pump circuit is coupled into a phase-locked loop circuit.

17. The charge pump circuit defined in claim 11 wherein the charge pump circuit is coupled into a delay-locked loop circuit.

18. A method for adjusting an output current of a charge pump circuit comprising:
coupling a first switch circuit module to a first current module to increase the output current of the charge pump circuit; and
closing first switches to allow control signals to control first switching transistors in the first switch circuit module.

19. The method defined in claim 18 further comprising:
coupling a second switch circuit module to a second current module by closing second switches to increase the output current of the charge pump circuit; and
closing third switches to allow control signals to control second switching transistors in the second switch circuit module.

20. A charge pump circuit comprising:
a first current module;
a first switch circuit module;
a first switch; and
second switches, wherein the first switch is closed to allow current flow between the first switch circuit module and the first current module, and the second switches are closed to allow control signals to control the first switch circuit module.

21. The charge pump circuit defined in claim 20 further comprising:
- a second current module;
- a second switch circuit module;
- a third switch; and
- fourth switches, wherein the third switch is closed to allow current flow between the second switch circuit module and the second current module, and the fourth switches are closed to allow control signals to control the second switch circuit module.

22. The charge pump circuit defined in claim 21 further comprising:
- a third current module;
- a third switch circuit module;
- fifth switches; and
- sixth switches, wherein the fifth switches are closed to allow current flow between the third switch circuit module and the third current module, and the sixth switches are closed to allow control signals to control the third switch circuit module.

* * * * *